(12) United States Patent
Sowlati et al.

(10) Patent No.: US 6,570,210 B1
(45) Date of Patent: May 27, 2003

(54) MULTILAYER PILLAR ARRAY CAPACITOR STRUCTURE FOR DEEP SUB-MICRON CMOS

(75) Inventors: Tirdad Sowlati, Ossining, NY (US); Vickram Vathulya, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 4 days.

(21) Appl. No.: 09/596,443

(22) Filed: Jun. 19, 2000

(51) Int. Cl.$^7$ .............................................. H01L 31/119
(52) U.S. Cl. ...................... 257/307; 257/303; 257/306; 257/308; 257/309; 257/532; 257/908
(58) Field of Search ................................ 257/303, 306, 257/308, 309, 307, 532, 908

(56) References Cited

U.S. PATENT DOCUMENTS

| | | | |
|---|---|---|---|
| 5,245,505 A | | 9/1993 | Shiga et al. ................ 361/311 |
| 5,583,359 A | * | 12/1996 | Ng et al. .................... 257/306 |
| 5,645,976 A | * | 7/1997 | Azuma ........................ 430/313 |
| 5,898,982 A | | 5/1999 | Metzler et al. ............ 29/25.42 |
| 5,903,492 A | * | 5/1999 | Takashima .................. 365/145 |
| 6,288,446 B2 | * | 9/2001 | Kwak et al. ................ 257/750 |

FOREIGN PATENT DOCUMENTS

WO    WO9627907    12/1996    ........... H01L/29/92

OTHER PUBLICATIONS

US 000097, U.S. Ser. No. 09/542,712, Filed Apr. 4, 2000.
US 000098, U.S. Ser. No. 09/542,711, Filed Apr. 4, 2000
US 000099, U.S. Ser. No. 09/545,785, Filed Apr. 7, 2000.
US 000100, U.S. Ser. No. 09/546,125, Filed Apr. 10, 2000.
Patent Abstracts of Japan, Matsumoto Yuzuro, "Board With Incorporated Capacitor," Publication No. 11312855, Sep. 11, 1999, Application No. 10118211, Apr. 28, 1998.

* cited by examiner

Primary Examiner—Eddie Lee
Assistant Examiner—Matthew E. Warren
(74) Attorney, Agent, or Firm—Aaron Waxler

(57) ABSTRACT

A capacitor structure, especially for use in deep sub-micron CMOS, having an array of electrically conductive pillars which form the plates of the capacitor. Each of the pillars is formed by electrically conductive lines segments from at least two different conductor levels electrically connected by an electrically conductive via. Dielectric material is disposed between the two conductor levels and the pillars of the array. The pillars are electrically connected to opposing nodes in an alternating manner so that the pillars are electrically interdigitated.

10 Claims, 9 Drawing Sheets

MULTILAYER PILLAR ARRAY CAPACITOR STRUCTURE FOR DEEP SUB-MICRON CMOS

RELATED APPLICATIONS

Commonly-assigned, copending U.S. patent application Ser. No. 09/545,785, entitled "Interdigitated Multilayer Capacitor Structure For Deep Sub-Micron CMOS", filed Apr. 7, 2000.

Commonly-assigned, copending U.S. patent application Ser. No. 09/542,711, entitled "Combined Transistor-Capacitor Structure In Deep Sub-Micron CMOS For Power Amplifiers", filed Apr. 4, 2000.

Commonly-assigned, copending U.S. patent application Ser. No. 09/546,125, entitled "Multilayered Capacitor Structure With Alternately Connected Concentric Lines For Deep Sub-Micron CMOS", filed Apr. 10, 2000.

Commonly-assigned, copending U.S. patent application Ser. No. 09/542,712, entitled "Multilayer Capacitor Structure Having An Array Of Concentric Ring-Shaped Plates For Deep Sub-Micron CMOS", filed Apr. 4, 2000.

FIELD OF THE INVENTION

This invention relates to capacitor structures for metal-oxide-semiconductors (MOS), and in particular, to a multilayer pillar array capacitor structure for deep sub-micron complementary MOS (CMOS).

BACKGROUND OF THE INVENTION

Conventional capacitor structures for deep sub-micron CMOS are typically constructed with two flat parallel plates separated by a thin dielectric layer. The plates are formed by layers of conductive material, such as metal or polysilicon. The capacitor structure is usually isolated from the substrate by an underlying dielectric layer. To achieve high capacitance density in these structures, additional plates are provided. FIG. 1 illustrates a conventional multilayer parallel plate capacitor structure 10 in a deep sub-micron CMOS. The capacitor structure 10 includes a vertical stack of electrically conductive lines 12 separated by dielectric layers 13. The conductive lines 12 and dielectric layers 13 are constructed over a semiconductor substrate 11. The conductive lines 12 form the plates or electrodes of the capacitor 10. The plates 12 are electrically connected together in an alternating manner such that all the "A" plates are of a first polarity and all the "B" plates are of a second polarity, opposite to the first polarity.

A major limitation associated with parallel plate capacitor structures is that the minimum distance between the plates does not change as geometries in CMOS processes are scaled down. Hence, gains in capacitance density are not realized during such down scaling.

Various other capacitor structures with high capacitance densities, such as double polysilicon capacitors and gate-oxide capacitors, are known in the art. Double polysilicon capacitors, however, do not lend themselves to deep sub-micron CMOS processes. Gate-oxide capacitors are generally not used in deep sub-micron CMOS processes because they have large gate areas which cause yield and reliability issues, they generate capacitances which vary with voltage, and may experience high voltages that can breakdown the gate-oxide.

Trench capacitor structures for dynamic random access memories (DRAMs) have high capacitance densities. Such capacitors are formed by etching a trench in the substrate and filling the trench with conductive and dielectric material to form a vertical capacitance structure. However, trench capacitors are costly to fabricated because they add etching and trench filling processes.

Interdigitated capacitor structures are used in microwave applications. These capacitors have closely placed, inter-digitated conductive line structures which produce fringing and cross-over capacitances therebetween to achieve capacitance. However, the cross-over capacitance produced by interdigitated capacitors is limited to a single conductor level.

Accordingly, a need exists for an improved capacitor structure for deep sub-micron CMOS structures, having a high capacitance density which increases with shrinking semiconductor process geometries.

SUMMARY OF THE INVENTION

A capacitor structure, especially for use in deep sub-micron CMOS, comprising an array of electrically conductive pillars which form the plates of the capacitor. Each of the pillars is formed by electrically conductive lines segments from at least two different conductor levels electrically connected by an electrically conductive via. Dielectric material is disposed between the two conductor levels and the pillars of the array. The pillars are electrically connected to opposing nodes in an alternating manner so that the pillars are electrically interdigitated.

BRIEF DESCRIPTION OF THE DRAWINGS

The advantages, nature, and various additional features of the invention will appear more fully upon consideration of the illustrative embodiments now to be described in detail in connection with accompanying drawings wherein.

It should be understood that the drawings are for purposes of illustrating the concepts of the invention and are not to scale.

DETAILED DESCRIPTION OF THE INVENTION

Figure 2:
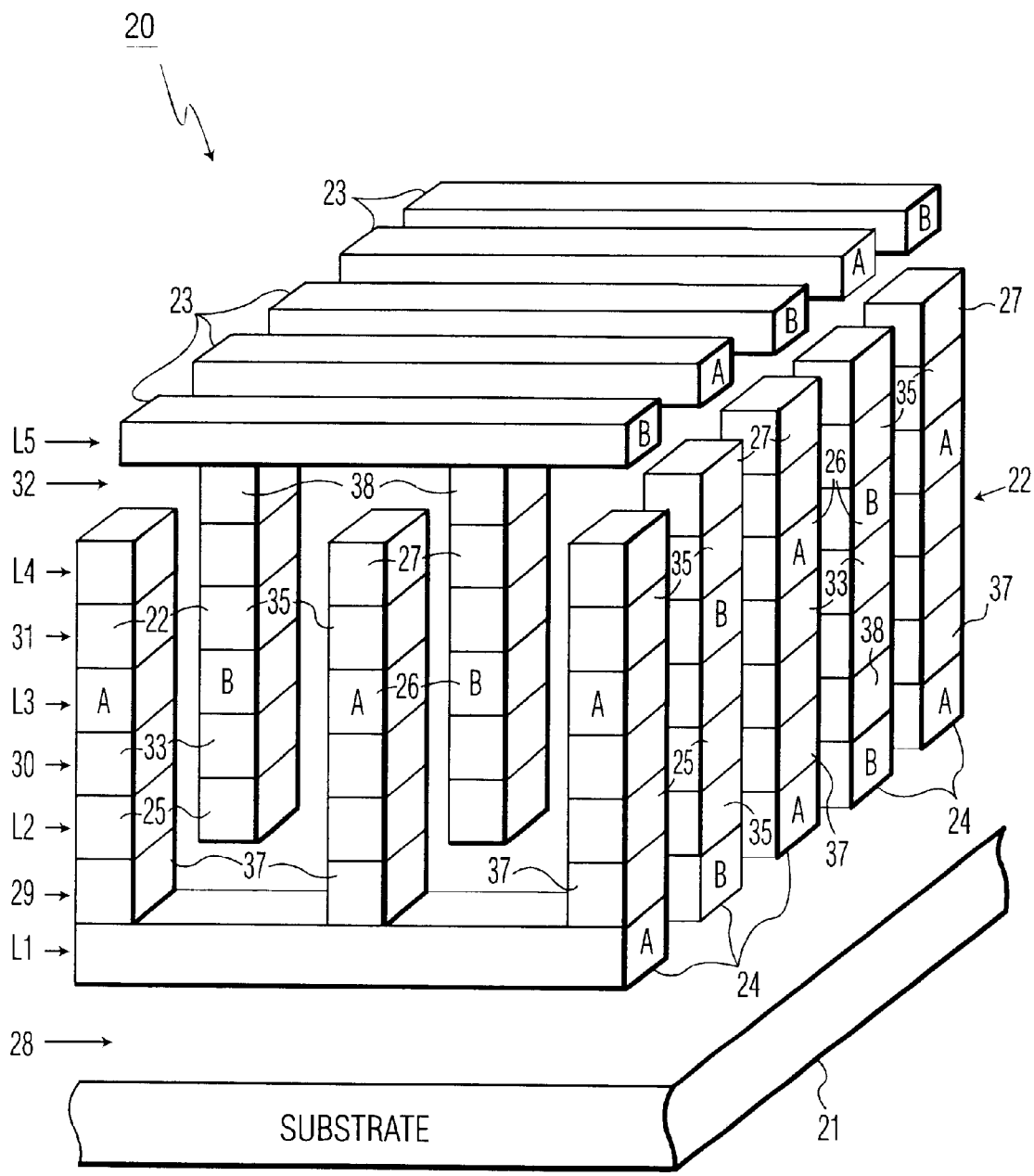
FIG. 2 is a perspective view of a multilayer pillar array (MLPA) capacitor structure according to an embodiment of the invention.
Figure 3:
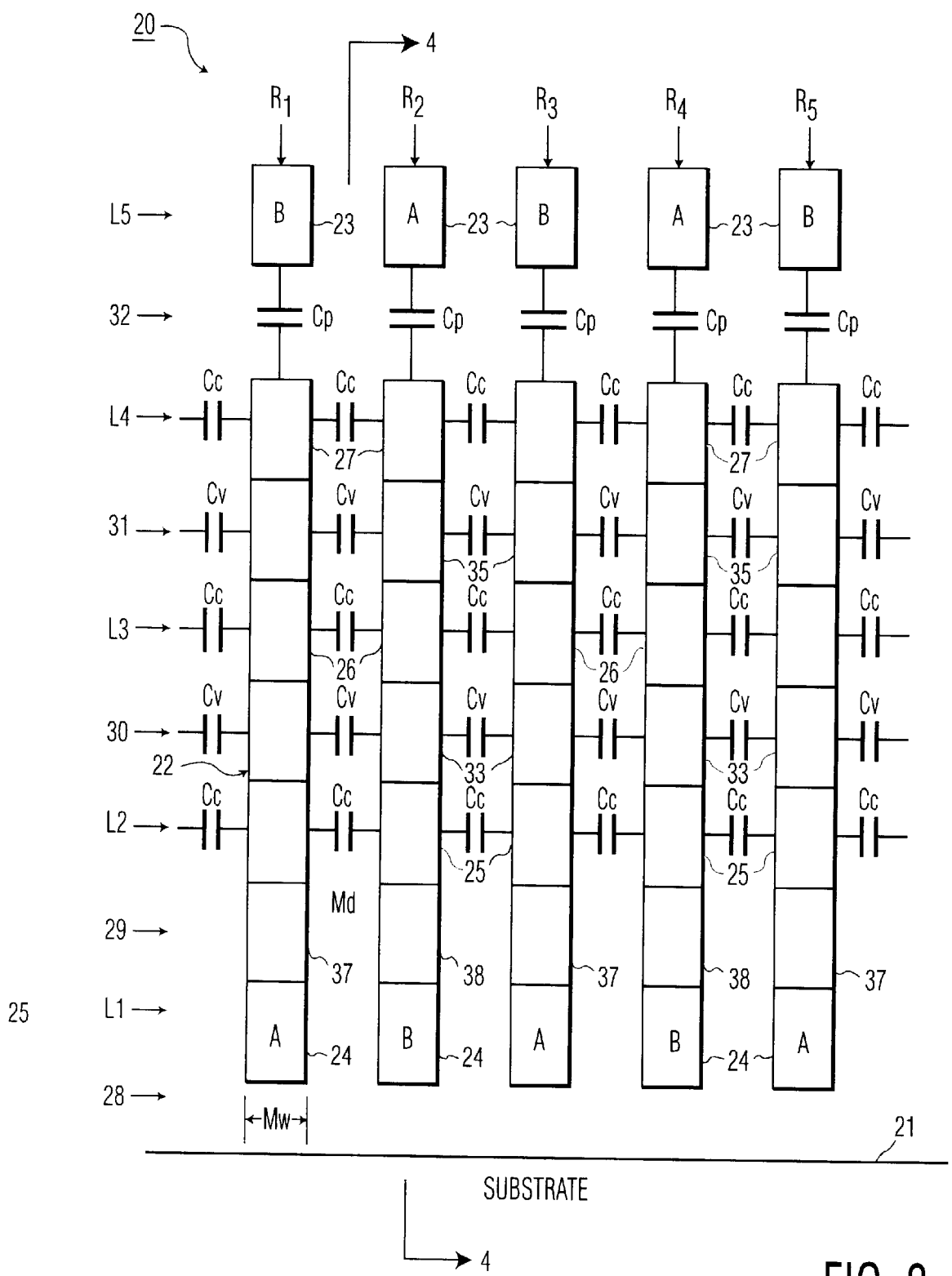
FIG. 3 is a side elevational view of the MLPA capacitor structure of FIG. 2.
Figure 4:
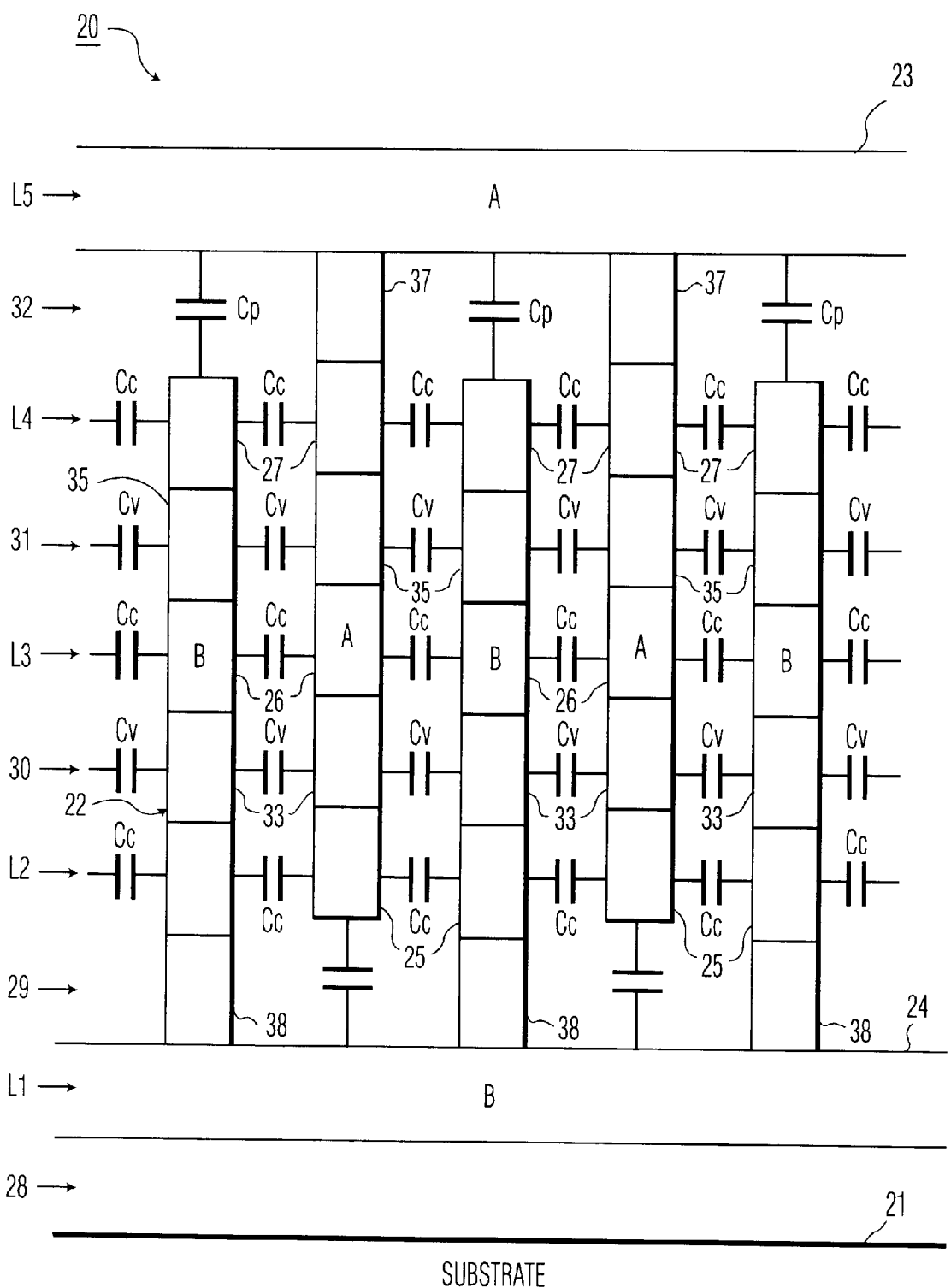
FIG. 4 is an sectional view of the MLPA capacitor structure through line 4—4 of FIG. 2.

FIGS. 2–4 collectively illustrate a multilayer pillar array (MLPA) capacitor structure 20 in a deep sub-micron CMOS, according to a first embodiment of the invention. The MLPA capacitor structure 20 includes a close-packed, two-directional parallel array of electrically conductive, vertical pillars 22 sandwiched between top and bottom parallel inline arrays of electrically conductive, horizontal lines 23, 24. The vertical pillars 22 and the horizontal lines 23, 24 operate as electrodes for the MLPA capacitor 20. The vertical pillars 22 generate "cross-over" type capacitances $C_c$ between each other, and "parallel plate" type capacitances $C_p$ with the horizontal lines 23, 24. The vertical pillars 22 and horizontal plates 23, 24 are constructed over a substrate 21 of semiconductor material in a multiple conductor level process (five electrical conductor levels L1–L5 are depicted for illustrative purposes only). The first conductor level L1 defines the bottom parallel array of electrically conductive horizontal lines 24, and the fifth conductor level L5 defines the top parallel array of electrically conductive horizontal lines 23. The lines 24 of the bottom array have polarities which alternate in an ABABA pattern and the lines 23 of the top array have polarities which alternate in a BABAB pattern. Each of the second, third, and fourth conductor levels L2–L4 defines a parallel array of electrically conductive horizontal line segments 25, 26, 27. A first dielectric layer 28 fills the space between the substrate 21 and the first conductor level L1; a second dielectric layer 29 fills the space between the first and second conductor levels L1, L2; a third dielectric layer 30 fills the space between the second and third conductor levels L2, L3 and the line segments 25 of the second conductor level L2; a fourth dielectric layer 31 fills the space between the third and fourth conductor levels L3, L4 and the line segments 26 of the third conductor level L3; and a fifth dielectric layer 32 fills the space between the fourth and fifth conductor levels L4, L5 and the line segments 27 of the fourth conductor level L4.

As best illustrated in FIG. 3, the conductive lines 23, 24 and conductive line segments 25–27 are aligned over each other in vertical in rows R1–R5. The conductive line segments 25–27 in each vertical row are electrically interconnected by electrically conductive vias 33, 35 which extend vertically through the third and fourth dielectric layers 30, 31. The vertical rows R1–R5 of conductive line segments 25–27 and vias 33, 35 form the vertical pillars 22.

Figure 5:
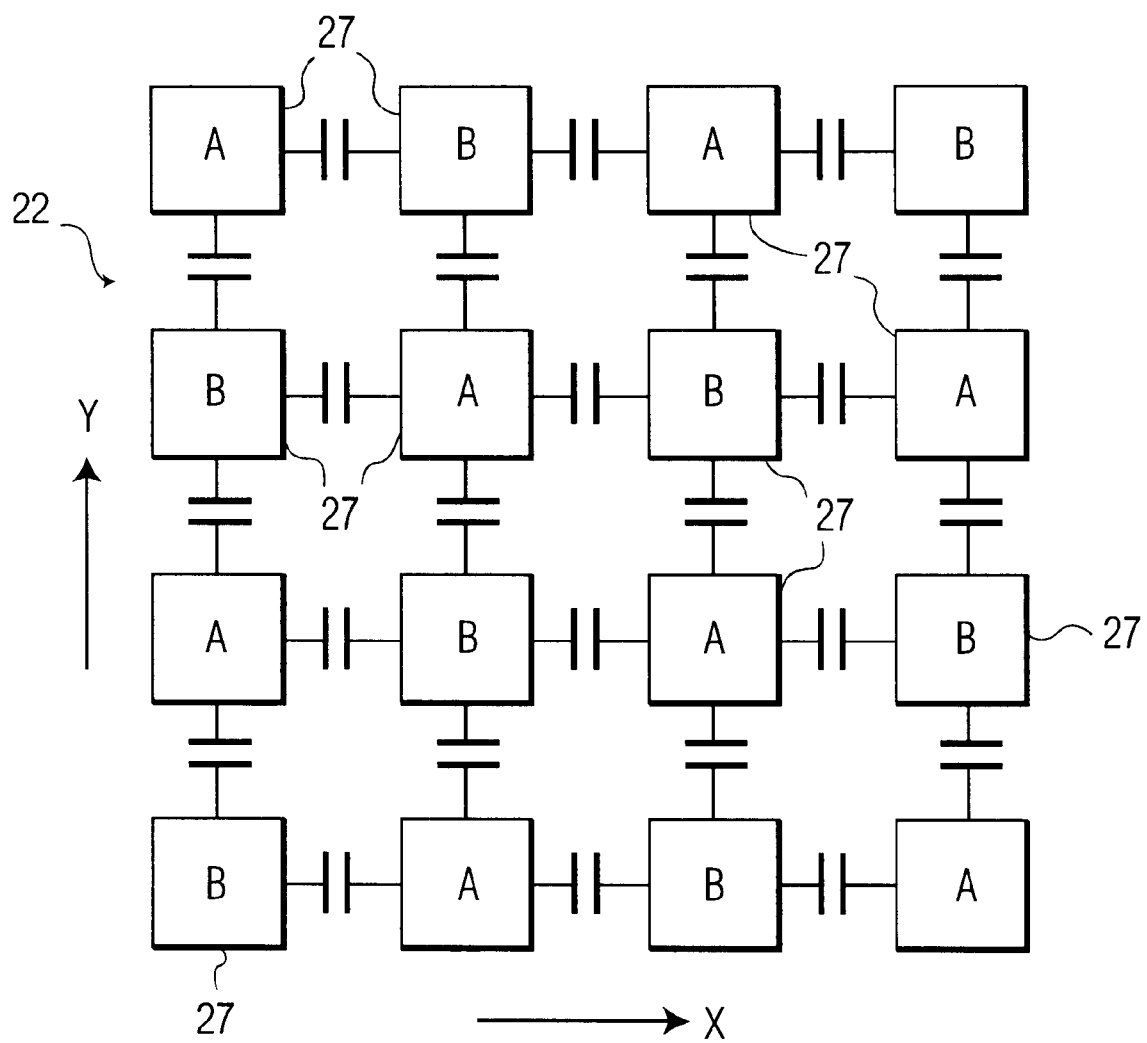
FIG. 5 is a top plan view of one of the conductor levels in the MLPA capacitor structure of FIG. 2 illustrating the conductive line segments.

As illustrated in FIG. 5, the pillars 22 are electrically interdigitated in both the X and Y directions to maximize the cross-over capacitance $C_c$ therebetween. This is accomplished as illustrated in FIGS. 2–4 by electrically connecting the pillars 22 denoted by the letter "A" to the top and bottom "A" lines 23, 24 (node A of the capacitor 20) in the first and fifth conductor levels L1, L5 with a first group of electrically conductive vias 37 which extend-through the second and fifth dielectric layers 29, 32. The pillars 22 denoted by the letter "B" are electrically connected to the top and bottom "B" lines 23,24 (node B of the capacitor 20) in the first and fifth conductor levels L1, L5 with a second group of electrically conductive vias 38 which also extend through the second and fifth dielectric layers 29, 32.

The total capacitance $C_{Total}$ generated by the MLPA capacitor 20 is equal to:

$$C_{Total} = \Sigma C_c + \Sigma C_V + \Sigma C_p$$

where Cc represents the cross-over capacitance between laterally adjacent line segments, Cv represents the cross-over capacitance between laterally adjacent vias, and Cp represents the parallel plate capacitance between vertically adjacent line segments and lines. Hence, the MLPA capacitor 20 of the invention makes extensive use of the cross-over capacitances generated between the conductive line segments 25–27 and vias 33, 35.

In present state-of-the-art deep sub-micron CMOS technology, conductive line spacings of about 0.5 microns or less is common. Thus, the minimum distance between the vertical pillars 22 of the MLPA capacitor 20 is typically equal to or less than about 0.5 microns. The sub-micron spacings between the pillars 22 of the capacitor 20 increase its the capacitance density as compared to what can be achieved using conventional parallel plate capacitors.

Figure 1:
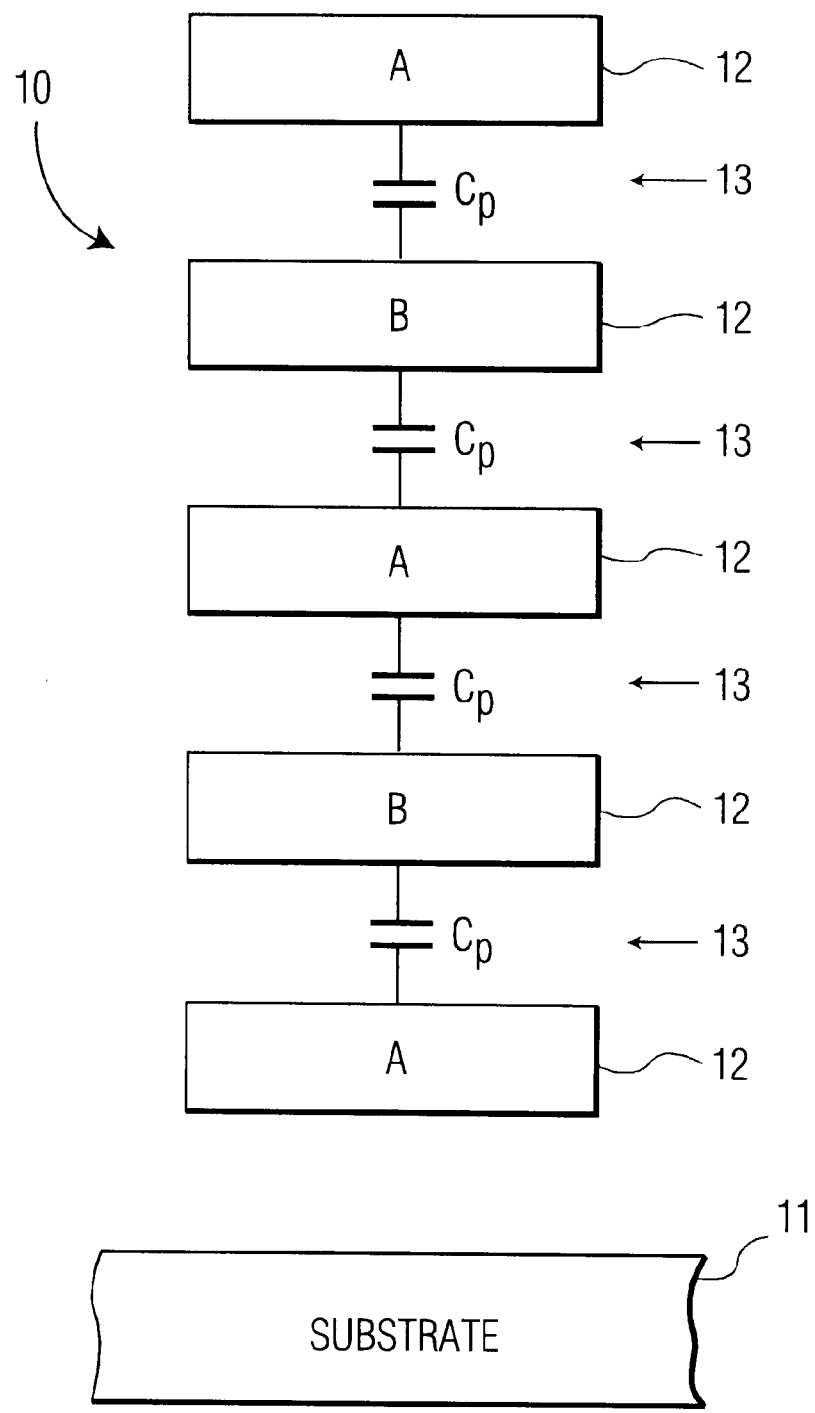
FIG. 1 is a side elevational view of a conventional parallel plate capacitor structure in a deep sub-micron CMOS.

The improvement in capacitance density and capacitance can be seen by comparing the extracted capacitance values of a conventional multilayer parallel plate capacitor similar to the one illustrated in FIG. 1, constructed with 5 levels and having dimensions of 16 microns×16 microns (not including the vias around the capacitor), with a MLPA capacitor similar to the one illustrated in FIGS. 2–4 constructed with 5 conductor levels and having dimensions of 16 microns×16 microns (using minimum sized vias). Both capacitors were constructed in a 0.25 micron CMOS process. The extracted parallel plate capacitance and capacitance density of the parallel plate capacitor 40 was 46.6 fF and 0.18 fF/micron$^2$ respectively, compared to the cross-over plus parallel plate capacitance and capacitance density (capacitance Cv of the vias not capable of being extracted) of the MLPA capacitor which was found to be 144 fF and 0.56 fF/micron$^2$ respectively. Because the capacitance Cv of the vias was not capable of being extracted, the real capacitance value of the MLPA capacitor could actually be larger than what was extracted.

As the geometries in semiconductor process technologies continue to shrink and scale down, the capacitance density of the MLPA capacitor of the invention will increase. This is because the minimum width $M_w$ of the conductive lines 23, 24 and line segments 25–27, the minimum distance between the vias 33, 35 connecting the line segments, and the minimum distance $M_d$ between vertical pillars 22 of the MLPA capacitor of the invention will advantageously decrease. Such capacitance density increases are not possible in conventional multilayer parallel plate capacitors because the heights or thicknesses of the conductor and dielectric levels do not scale down. Hence, the distance between the plates will remain about 1 micron in conventional parallel plate capacitors.

Figure 6:
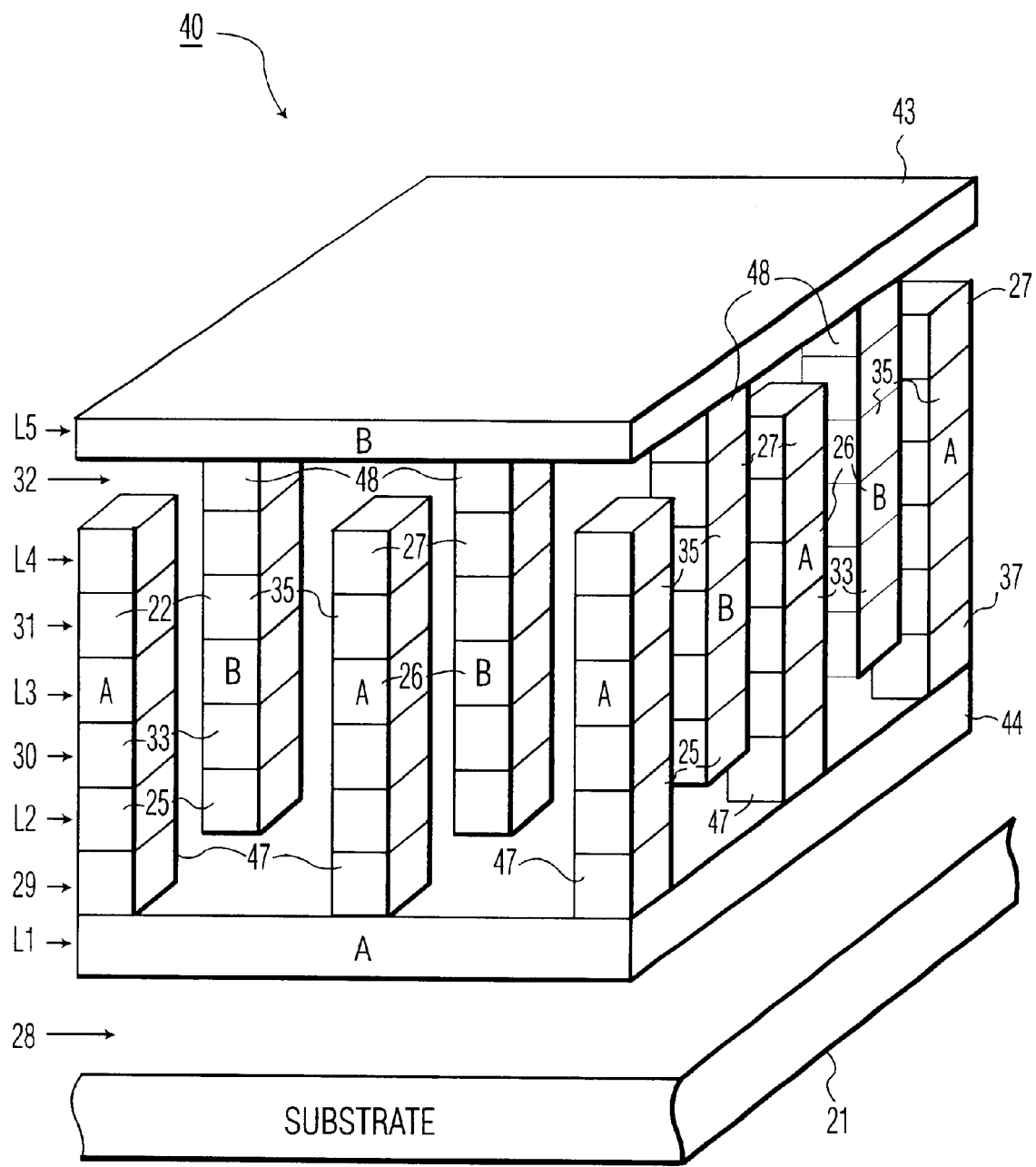
FIG. 6 is a perspective view of a MLPA capacitor structure according to a second embodiment.
Figure 7:
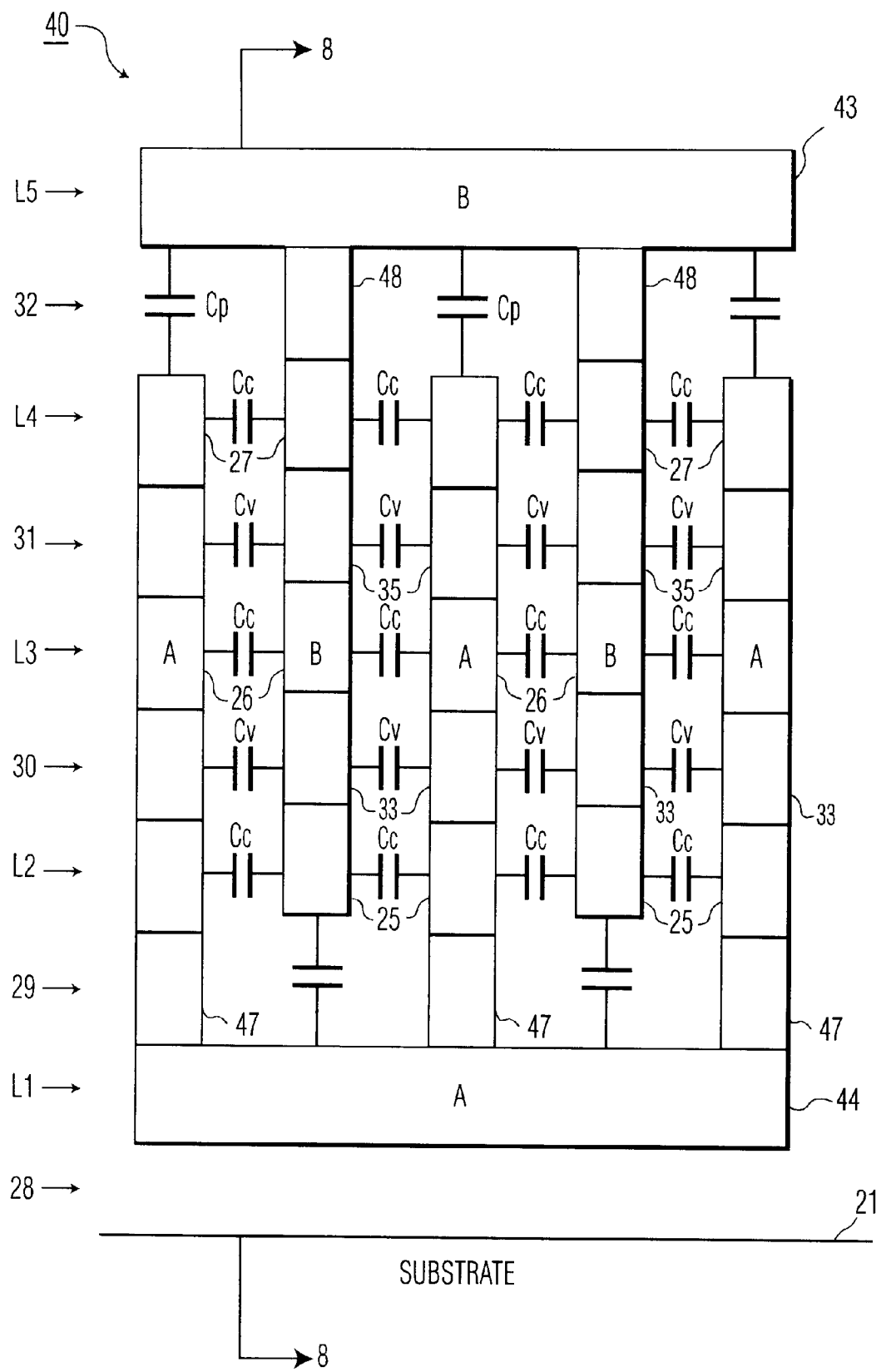
FIG. 7 is a side elevational view of the MLPA capacitor structure of FIG. 6.
Figure 8:
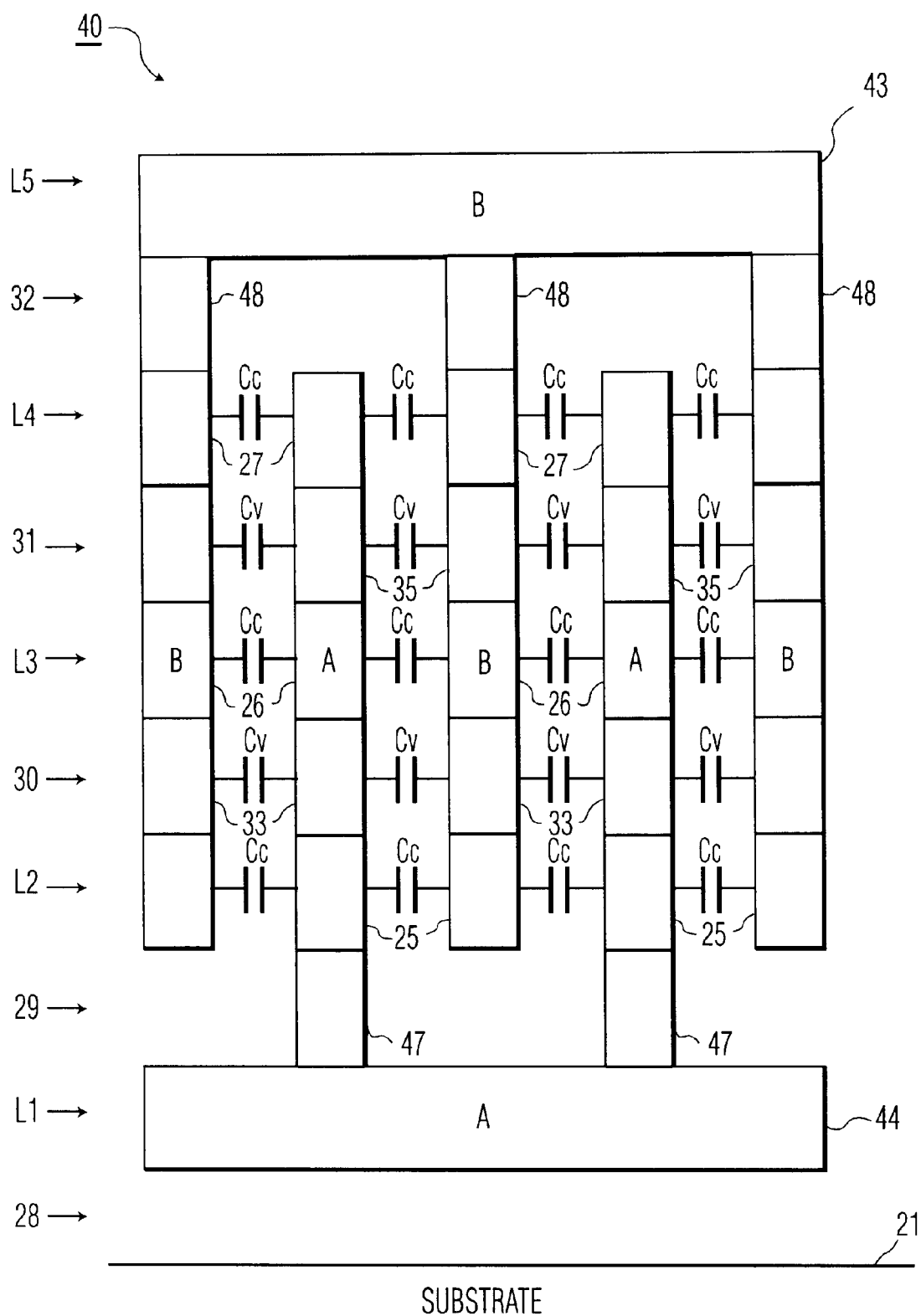
FIG. 8 is a sectional view of the MLPA capacitor structure through line 8—8 of FIG. 7.

FIGS. 6–8 collectively illustrate a MLPA capacitor structure 40 according to a second embodiment of the invention, where the like elements are identified by the same numerals. In this embodiment, vertical pillars 22 like to those described in the previous embodiment are sandwiched between top and bottom electrically conductive horizontal plates 43, 44 of opposite polarity. The pillars 22 in the second embodiment of the invention are also electrically interdigitated in both the X and Y directions to maximize the cross-over capacitance $C_c$ therebetween. This is accomplished in the second embodiment by electrically connecting the pillars 22 denoted by the letter "A" to the bottom plate 44 (node A of the capacitor 40) in the first conductor level L1 with a first group of electrically conductive vias 47 that extend through the second dielectric layer 29. The pillars 22 denoted by the letter "B" are electrically connected to the top plate 43 (node B of the capacitor 20) in the fifth conductor level L5 with a second group of electrically conductive vias 48 that extend through the fifth dielectric layer 32.

The MLPA capacitor structure 40 of the second embodiment also provides improved capacitance density and capacitance over that of a conventional multilayer parallel plate capacitor, although these improvements are somewhat less than that of the MLPA capacitor of the first embodiment because it does not use cross-over capacitances in L1 and L5. A MLPA capacitor similar to the one illustrated in FIGS. 6–8 constructed in a 0.25 micron CMOS process with 5 conductor levels and having dimensions of 16 microns×16 microns (using minimum sized vias), had a capacitance and capacitance density (capacitance $C_v$ of the vias not capable of being extracted) of 126 fF and 0.49 fF/micron$^2$ respectively.

Figure 9:
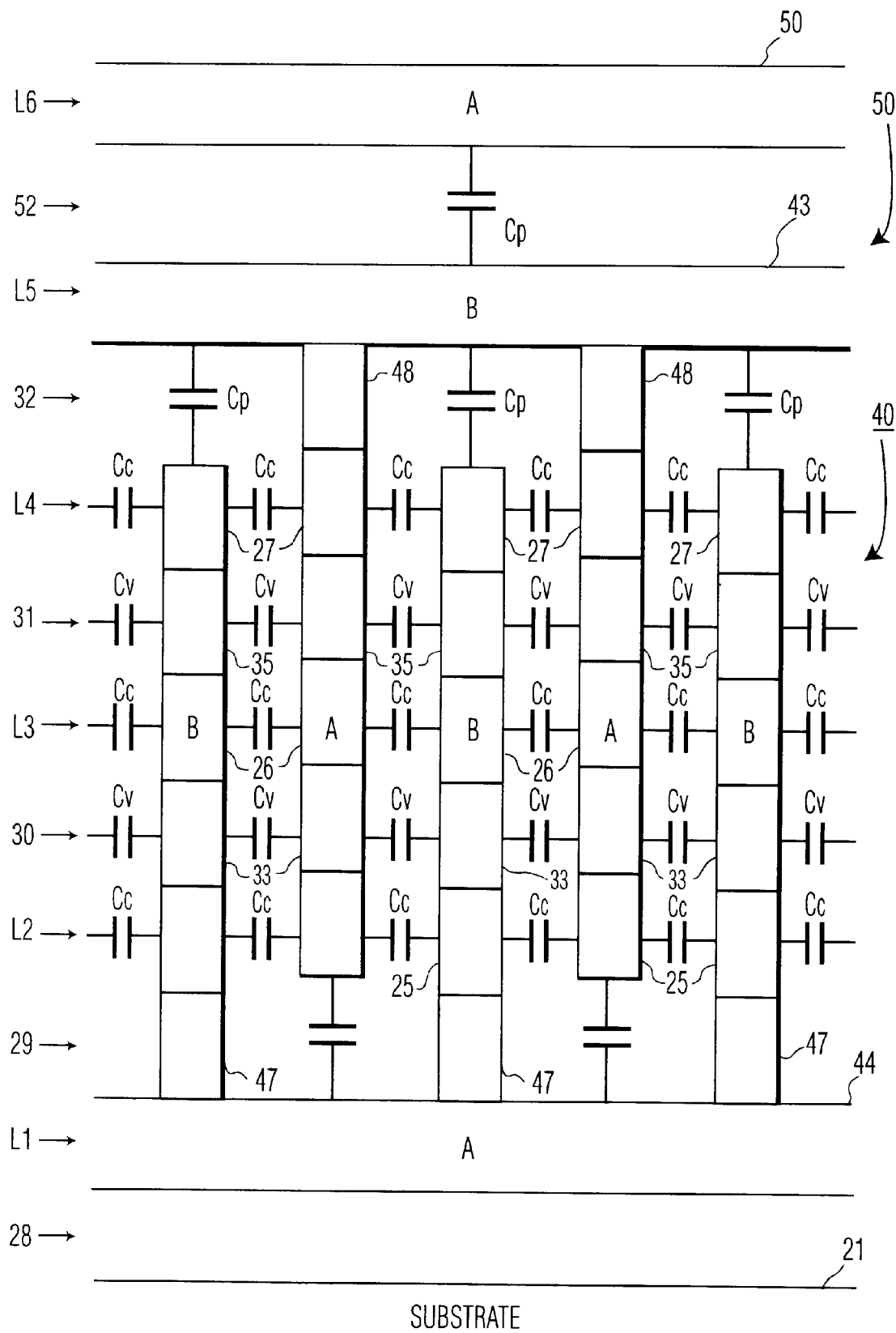
FIG. 9 is a side elevational view of the MLPA capacitor structure according to the second embodiment of the invention combined with a conventional parallel plate capacitor structure.

As illustrated in FIG. 9, the MLPA capacitor 40 of the second embodiment of the invention can be combined with a conventional parallel plate capacitor 50 when additional conductor levels are available. The parallel plate capacitor 50 is formed by a third horizontal plate 51 in a sixth conductor level L6, and a sixth dielectric layer 52 disposed between the fifth and sixth conductor levels L5, L6.

Depending on the fabrication techniques used for making the vias, the pillar array of the MLPA capacitor structure in some embodiments may not extend up to the fifth conductor level L5 as shown in the figures, and may for example only extend as far as the fourth conductor level L4. This may occur when the minimum dimensions of the vias connecting the first, second, third and fourth conductor levels L1–L4 are smaller than the minimum dimensions of the vias connecting the fourth and fifth conductor levels L4 and L5. In such embodiments, the fifth conductor level L5 can include a horizontal plate similar to the plate used in sixth level L6 of the embodiment illustrated in FIG. 9. The horizontal plate in the fifth conductor level L5 can be electrically terminated such that it produces a parallel plate type capacitance in cooperation with the uppermost conductor level (the fourth conductor level L4) of the MLPA capacitor structure which increases the overall capacitance of the entire capacitor structure.

The MLPA capacitor structure of the invention is typically manufactured in silicon using conventional deep sub-micron CMOS processing. The MLPA capacitor structure of the invention can also be manufactured in gallium arsenide or any other suitable semiconductor system using conventional deep sub-micron processing. Manufacturing in silicon using deep sub-micron CMOS processing, usually involves growing or depositing a first layer of silicon dioxide on a selected portion of the silicon semiconductor substrate to form the first dielectric layer. The silicon dioxide layer has a thickness in the range of about one micron. A first layer of metal, such as aluminum, or highly conductive polysilicon, is deposited on the first dielectric layer of silicon dioxide. This layer of metal is then defined into the conductive lines of the first embodiment using well known masking and dry etching techniques to form the first conductor level. When making the MLPA capacitor structure of the second embodiment, this step forms a plate rather than conductive lines. As mentioned above, the width and spacing of the conductive lines (and line segments) are set to the minimum dimensions of the process to enhance the capacitances of the structure, i.e., the lines and spacing between the lines are as narrow as possible.

A second layer of silicon dioxide is then grown or deposited over the conductive lines or plate to form the second dielectric layer. The thickness of the second dielectric layer of silicon dioxide is in the range of about one micron. A plurality of holes, which extend down to the first conductor level are defined in the second dielectric layer of silicon dioxide and then filled with metal or polysilicon using conventional via fabrication techniques to form the vertically extending vias in the second dielectric layer. A second layer of metal, such as aluminum, or polysilicon, is deposited on the second dielectric layer of silicon dioxide and then defined into the conductive line segments of the second conductor level. The remaining dielectric layers, vias, conductor levels, and conductive lines and line segments, are fabricated in the same manner as described above.

One of ordinary skill in the art will recognized that specialized dielectric materials can be used in place of silicon dioxide (silicon systems) or silicon nitride (gallium arsenide systems) to form the dielectric layers. For example a ferro-electric ceramic, such as PLZT (lanthanum-modified lead zirconate tantalate) can be used to form the dielectric layers. The use of PLZT layers greatly enhances capacitance as PLZT has a dielectric constant of approximately 4,700, in contrast to 3.9 for the dielectric constant of silicon dioxide.

The ordinary skill artisan will further recognize that the MLPA capacitor structure of the invention can be useful in many applications, such as RF, analog and digital applications. RF circuit applications employ capacitors for matching. The larger the capacitance per unit area, the smaller the area and the lower the cost. In analog circuit applications, undesirable noise can often be reduced by using large capacitors (KT/C). In digital circuit applications, large decoupling capacitances are often very important and can be easily provided with the capacitor structure of the invention. The capacitor structure of the invention also lends itself to being easily programmed into a standard pcell for layout generation.

While the foregoing invention has been described with reference to the above embodiments, additional modifications and changes can be made without departing from the spirit of the invention. Accordingly, all such modifications and changes are considered to be within the scope of the appended claims.

What is claimed is:

1. A capacitor comprising:
   an array of electrically conductive pillars positioned vertically with respect to a substrate, each of the pillars including electrically conductive lines segments from at least two different conductor levels electrically connected by an electrically conductive via; and
   dielectric material disposed between the two conductor levels and the pillars of the array, the via extending through the dielectric material;
   wherein the pillars are electrically connected to nodes of opposite electrical polarity in an alternating manner so that the pillars are electrically, and not physically, interdigitated, and operate as capacitor plates, and wherein the pillar array extends in two directions.

2. The capacitor according to claim 1, further comprising:
   a third conductor level including a first array of electrically conductive lines disposed above the pillar array, the lines of the third conductor level electrically connecting alternating ones of the pillars to the nodes of opposite electrical polarity; and
   a fourth conductor level including a second array of electrically conductive lines disposed below the pillar array, the lines of the fourth conductor level electrically connecting the remaining pillars to the nodes of opposite electrical polarity.

3. The capacitor according to claim 2, wherein the lines of the third conductor level having alternating polarities and the lines of the fourth conductor level have alternating polarities the polarities of the lines of the third conductor level being opposite to the polarities of corresponding lines in the fourth conductor level.

4. The capacitor according to claim 1, further comprising:
   a third conductor level having an electrically conductive plate disposed above the pillar array, the plate of the third conductor level electrically connecting alternating ones of the pillars to one of the nodes; and a fourth conductor level having an electrically conductive plate disposed below the pillar array, the plate of the fourth.conductor level electrically connecting the remaining pillars to the other node.

5. The capacitor according to claim 4, further comprising at least a fifth conductor level having an electrically conductive plate disposed adjacent and parallel to the plate of one of the third and fourth conductor levels, the plate of the fifth conductor level being of an electrical polarity which is opposite to that of the plate of the one of the third and fourth conductor levels.

6. The capacitor according to claim 1, wherein the capacitor is constructed over a substrate.

7. The capacitor according to claim 6, wherein the substrate is made from a semiconductor material.

8. The capacitor according to claim 1, wherein the capacitor comprises a sub-micron MOS structure.

9. The capacitor according to claim 1, wherein the capacitor comprises a sub-micron CMOS structure.

10. The capacitor according to claim 1, wherein the conductive line segments are made from one of a metal material and conductive semiconductor material.

* * * * *